United States Patent [19]

Ootsuka

[11] 4,379,318
[45] Apr. 5, 1983

[54] OVERCURRENT SAFETY CONSTRUCTION FOR A PRINTED CIRCUIT BOARD

[75] Inventor: Tetsuo Ootsuka, Yokohama, Japan

[73] Assignee: Nissan Motor Company, Limited, Yokohama, Japan

[21] Appl. No.: 187,713

[22] Filed: Sep. 16, 1980

[30] Foreign Application Priority Data

Sep. 21, 1979 [JP] Japan ............................ 54-129973[U]

[51] Int. Cl.³ .............................................. H02H 7/20
[52] U.S. Cl. .................................... 361/104; 361/400; 29/577 C; 29/623; 29/829; 29/846; 337/290; 337/295; 337/297
[58] Field of Search .............. 361/104, 103, 397, 400, 361/402, 405, 404, 406, 409, 430, 401; 337/1, 290, 295–297, 232; 307/303, 310, 202.1; 29/577 R, 577 C, 585, 829, 840, 846, 847, 849, 852, 740, 623; 357/51, 5, 45

[56] References Cited

U.S. PATENT DOCUMENTS

| | | | |
|---|---|---|---|
| 3,646,666 | 3/1972 | Boleky et al. | 361/104 X |
| 3,699,403 | 10/1972 | Boleky | 29/585 X |
| 3,967,161 | 6/1976 | Lichtblau | 361/402 |
| 4,140,988 | 2/1979 | Oakes | 337/297 X |
| 4,272,753 | 6/1981 | Nicolay | 337/297 |
| 4,296,398 | 10/1981 | McGalliard | 361/104 x |

FOREIGN PATENT DOCUMENTS

| | | |
|---|---|---|
| 752985 | 2/1967 | Canada . |
| 867090 | 5/1961 | United Kingdom . |
| 1152246 | 5/1969 | United Kingdom . |
| 1228599 | 4/1971 | United Kingdom . |
| 1336938 | 11/1973 | United Kingdom . |

OTHER PUBLICATIONS

I.B.M. Tech. Disclosure Bulletin, vol. 19, No. 5, Oct. 1976, "Protection of Printed-Circuit Cards" by Hammer et al.

Primary Examiner—Patrick R. Salce
Attorney, Agent, or Firm—Schwartz, Jeffery, Schwaab, Mack, Blumenthal & Koch

[57] ABSTRACT

In a printed circuit board, a safety means is provided to prevent the circuit elements such as semiconductor devices, resistors, and the like from suffering damage due to overcurrent flow. The safety means thus improved has a narrow gap provided within a metal foil pattern on the surface of the printed circuit board and a low-melting point metal such as solder bridges this gap to connect the metal foil.

2 Claims, 4 Drawing Figures

OVERCURRENT SAFETY CONSTRUCTION FOR A PRINTED CIRCUIT BOARD

BACKGROUND OF THE INVENTION (1) Field of the Invention

The present invention relates generally to an overcurrent safety construction for a printed circuit board and, more specifically, to an overcurrent protector provided on the rear surface of a printed circuit board made up of a metal foil and low-melting point solder whereby the circuit elements and board suffers from no damage due to overcurrent flow.

(2) Description of the Prior Art

The conventional safety construction arranged on a printed circuit board was a metal conductor itself in a form of aluminum or copper patterned on the rear surface of the printed circuit board.

In more detail, the conductor serving as a safety construction has its width narrower than other portions of the conductor so that an overcurrent does not pass through the conductor because the conductor melts as soon as an overcurrent occurs.

However, such a conventional safety construction for a printed circuit board has a shortcoming: since the overcurrent protector uses the same material as other conductors in the printed circuit board and has a narrow part, the narrow part in the conductor is melted only when an overcurrent of higher than for example 50 A flows therethrough. Therefore, in the case when a current somewhat higher than an ordinary current in the printed circuit board (for example, about 10 A excessing the allowable current of an ordinary safety means) flows therethrough, such a conventional safety construction does not function before the body of the printed circuit board is burned out because it takes too long for the metal conductor of the safety construction to arrive at its melting point (for copper 1083° C. and for aluminum 670° C.).

SUMMARY OF THE INVENTION

With the shortcoming described above in mind, it is an object of the present invention to provide a safety construction for a printed circuit board such that a comparatively small current above a normal current flowing in the printed circuit board can be interrupted immediately without adversely affecting the circuit elements and the body of printed circuit board.

BRIEF DESCRIPTION OF THE DRAWINGS

The features and advantages of the safety construction for a printed circuit board of the present invention will be more clearly understood from the following description taken in conjunction with the attached drawings where like reference numerals designate corresponding elements, and in which.

DETAILED DESCRIPTION OF THE PREFERRED EMBODIMENTS

Figure 1:
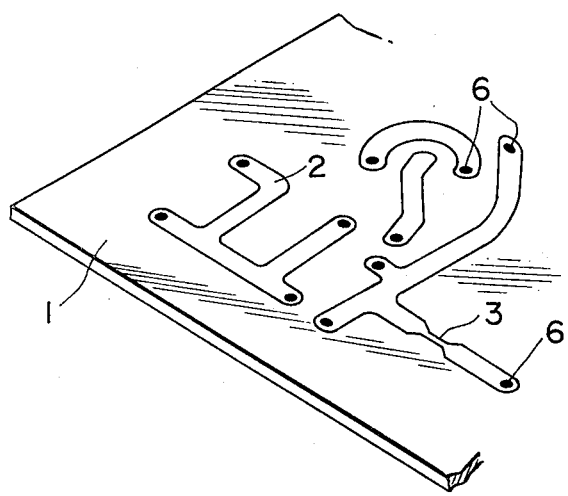
FIG. 1 is a partial perspective view of a conventional printed circuit board of the prior art.

To facilitate understanding the present invention, a brief reference will be made to a conventional safety construction for a printed circuit board. Referring to FIG. 1, numeral 1 denotes a board made of an insulating material such as resin. Numeral 2 denotes a metal foil patterned on the board 1. Numeral 3 denotes a narrow part whose width is made narrower than that of other metal foils so that its resistance is made particularly large. Consequently, when an abrupt large current flows into the narrow part 3 due to the occurrence of abnormality, the narrow part 3 of the metal foil 2 is melted to serve as the overcurrent protector means.

However, such a safety construction was ineffective for instantaneously interrupting a current somewhat larger than an ordinary current of about 1A or less using a simple reduction of cross section in the metal foil of the same material used.

Figure 2:
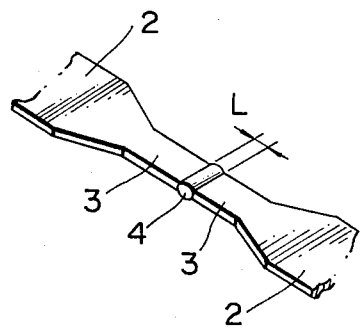
FIG. 2 is an enlarged view showing one embodiment of the present invention.
Figure 3:
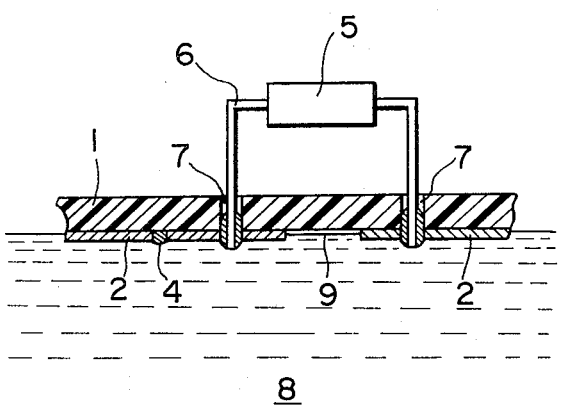
FIG. 3 shows an example of the soldering process for the printed circuit board according to the present invention.
Figure 4:
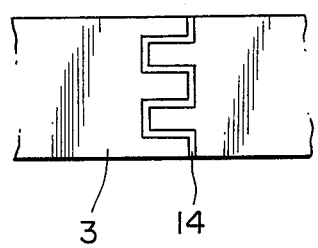
FIG. 4 is an enlarged view showing another embodiment of the present invention.

In view of the above description, reference is now made to FIGS. 2, 3, and 4, and more specifically to FIG. 2, wherein a preferred embodiment of the safety construction according to the present invention is illustrated.

FIG. 2 illustrates an enlargement of the narrow part 3 of the metal foil 2 shown in FIG. 1, wherein a narrow gap 4 is provided by a photo-etching process so as to intersect an elongated portion 3 of the metal foil 2. In the narrow gap 4, solder is filled up to bridge the opposing metal foil 3. Since the thickness of the metal foil 3 such as copper or aluminium is usually in the range of 35 $\mu$m to 70 $\mu$m, the metal foil 2 is cut off easily by the photoetching process, etc.

The width L below 0.3 mm is appropriate for the melted solder to fill the narrow gap 4 by capillary action. The solder will not flow into the narrow gap 4 if the width is above approximately 0.5 mm.

In FIG. 3, showing an example of the soldering process for the printed circuit board of the present invention, an aperture 7 formed by penetrating a portion of the board 1 and patterned metal foil 2 is provided to insert a lead 6 of a circuit element 5 from the front surface of the printed circuit board to the rear surface thereof. The rear surface of the printed circuit board is dipped in a reservoir of molten solder 8 in a conventional soldering process. At the same time as forming the connections between leads 6 and metal foils 2 by capillary action of the molten solder, the molten solder 8 of the reservoir permeates the narrow gap 4 and thus when the board 1 is removed from the reservoir, the solder solidifies to bridge the narrow gap in the metal foil 2. Since the gap 4 is of approximately the width described above, the solder will form a satisfactory bridge. On the other hand, the gap 9 is formed widely enough to prevent the solder from forming a bridge.

The following describes how the safety construction according to the present invention works. In general, a normal current used on a printed circuit board is very small: much less than 1 A. Since the narrow part of the metal foil and soldered gap will not generate heat under such a small current, the current flows therethrough normally. When an abnormality occurs and an overcurrent of, for example, 10 A flows, the soldered gap 4 will not melt instantly, but when such a current flows for a period of time, the soldered gap 4 will heat up since the resistance of solder is large and its conductivity is lower than the metal foil made of such as copper or aluminum.

As the temperature of the solder in the gap rises, the solder begins to melt when the temperature arrives at approximately 200° C. or the melting point of the solder. As the temperature rises higher, the solder will act as an overcurrent protector and splash to disconnect the gap in the metal foil 2. Therefore, such an abnormal current is interrupted without burning out the board 1 and circuit elements on the board 1, because they are not exposed to a high temperature.

When an abnormal larger current of, for example, 50 A flows, the solder in the gap 4 is melted immediately to interrupt the current flow so that the circuit elements and board 1 can be safely protected. Since the solder, where the lead 6 of a circuit element 5 is conncted to the corresponding metal foil 2, has a greater amount of solder used than that in the gap 4, it will not melt earlier than that in the gap 4.

FIG. 4 illustrates another embodiment of the present invention, where the gap 4 is in a crooked shape 14 so that the melting current is adjusted to a desired value and the heat generated before melting is dissipated in every direction.

As described hereinbefore, according to the present invention the overcurrent protector is provided on the rear surface of the printed circuit board in such an arrangement that an intermediate part of the metal foil is provided with a narrow gap in which a low-melting point metal is filled up to bridge the gap so that the low-melting point metal is melted in an abnormal current ranging from currents of about 1 A to higher currents without damage to the board and circuit elements mounted thereon, etc. In addition, in the soldering process of the printed circuit board, the soldering in the narrow gap can be made at the same time that other parts of the circuit elements are soldered to the corresponding metal foils, thus reducing the time required to complete soldering of the printed circuit board.

It will be understood by those skilled in the art that the foregoing description is in terms of preferred embodiments of the present invention wherein various changes and modifications may be made without departing from the spirit and scope of the invention, which is to be defined by the appended claims.

What is claimed is:

1. A method of manufacturing a printed circuit board having an overcurrent safety construction for protecting electrical components of the printed circuit board against overcurrent damage, which comprises the steps of:
   (a) forming a metal foil pattern on the board and simultaneously forming a narrow gap in said metal foil between the position at which said pattern is to be connected to a power source and the position at which said components to be protected are to be mounted on said board;
   (b) mounting said circuit components on said board; and
   (c) dipping the printed circuit board in a reservoir of molten solder so as to form simultaneously a bridge across the gap and connections to said components in circuit mounted on the board.

2. The method as set forth in claim 1 wherein the step of forming a narrow gap comprises forming said narrow gap in the form of non-aligned line segments.

* * * * *